(12) United States Patent
Li et al.

(10) Patent No.: US 6,641,940 B1
(45) Date of Patent: *Nov. 4, 2003

(54) LOW LOSS DIELECTRIC MATERIALS FOR MICROWAVE APPLICATIONS

(75) Inventors: Yi-Qun Li, Walnut Creek, CA (US); Xiao-Dong Xiang, Alameda, CA (US); Yi Dong, Albany, CA (US); Shifan Cheng, Concord, CA (US); Gang Wang, Albany, CA (US); Ning Wang, Concord, CA (US)

(73) Assignee: Intematix Corporation, Moraga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/974,430

(22) Filed: Oct. 9, 2001

(51) Int. Cl.$^7$ ................................................. B32B 9/00
(52) U.S. Cl. ..................... 428/702; 428/701; 501/134; 501/137
(58) Field of Search ................................ 428/701, 702, 428/697, 699; 501/134, 137

(56) References Cited

U.S. PATENT DOCUMENTS

| | | | | |
|---|---|---|---|---|
| 4,987,107 A | * | 1/1991 | Narumi et al. | 501/137 |
| 5,314,651 A | * | 5/1994 | Kulwicki | 264/65 |
| 6,045,932 A | * | 4/2000 | Jia et al. | 428/702 |

* cited by examiner

Primary Examiner—Deborah Jones
Assistant Examiner—Arden Sperty
(74) Attorney, Agent, or Firm—John F. Schipper (57) ABSTRACT

Composition for a solid state material, in bulk and in thin film form, that provides relatively high dielectric permittivity that is tunable with variable electrical field bias, relatively low loss tangent and low leakage current for microwave applications. In a first embodiment, the material is $Ba_ySr_{1-y}Ti_{1-x}M_xO_3$, where M is a substance or mixture including one or more elements drawn from a group consisting of Ta, Zr, Hf, V, Nb, Al, Ga, Cr, Mo, W, Mn, Sc and Re, and the indices x and y satisfy $0 \leq x \leq 1$ and $0 \leq y \leq 1$. A preferred choice is M=Ta, V, W, Mo and/or Nb. In a second embodiment, the material is $Ba_ySr_{1-y}Ti_{1-x-z}Ta_xM_zO_3$, where M is a substance or mixture including one or more trivalent elements drawn from a group consisting of Al, Ga and Cr and the indices x, y and z satisfy $0 \leq x+z \leq 1$ and $0 \leq y \leq 1$.

4 Claims, 9 Drawing Sheets

LOW LOSS DIELECTRIC MATERIALS FOR MICROWAVE APPLICATIONS

FIELD OF THE INVENTION

This invention relates to provision of new compositions of materials that have very low loss and relatively high dielectric permittivities at microwave frequencies.

BACKGROUND OF THE INVENTION

An ideal solid state material for some microwave applications would have an associated loss, measured by the parameter $\tan\delta$, that is no larger than 0.001, would have an associated relative dielectric coefficient $\in_{rel}$ that is 100–1000, and would have a resonance frequency that is tunable over a range of 50 percent or more of a central frequency. It is unlikely that a material having all these characteristics exists, although workers in this field continue to search for "best possible" materials, based on relaxed criteria. The combined criteria set forth in the preceding are stronger than are needed in some applications. What is needed is a group of materials that comply with less daunting requirements that still permit fabrication and practical use of such materials in real world environments.

SUMMARY OF THE INVENTION

These needs are met by the invention, which provides a group of materials in which electrical conductivity is suppressed, providing very low associated loss coefficients $\tan\delta$ and providing fairly high relative dielectric coefficients $\in$. A general chemical composition for this group of materials is $(Ba_ySr_{1-y})(Ti_{1-x}M_x)O_3$, with $0 \leq x \leq 1$ and $0 \leq y \leq 1$, and M is a substance or mixture including one or more of the elements Ta, Zr, Hf, V, Nb, Mo, W, Mn, Sc, Re, Al, Gd and Cr. Preferably, one or more of the elements represented by the symbol M has a valence of at least 4 in at least one oxidization state. The material may include one or more additives drawn from a second group including Mg, Ca, Sc, Y, La, Ce, Al, Ga, Cr and Nd.

DESCRIPTION OF BEST MODES OF THE INVENTION

The invention includes solid state chemical compositions of the form $(Ba_ySr_{1-y})(Ti_{1-x}M1_x)O_3$, with $0 \leq x \leq 1$ and $0 \leq y \leq 1$, where M is a substance or mixture including one or more of the elements Ta, Zr, Hf, V, Nb, Mo, W, Mn, Sc, Re, Al, Ga and Cr. The substance or mixture M preferably has a valence of at least 4 in a selected oxidization state.

Example 1

Figure 1A:
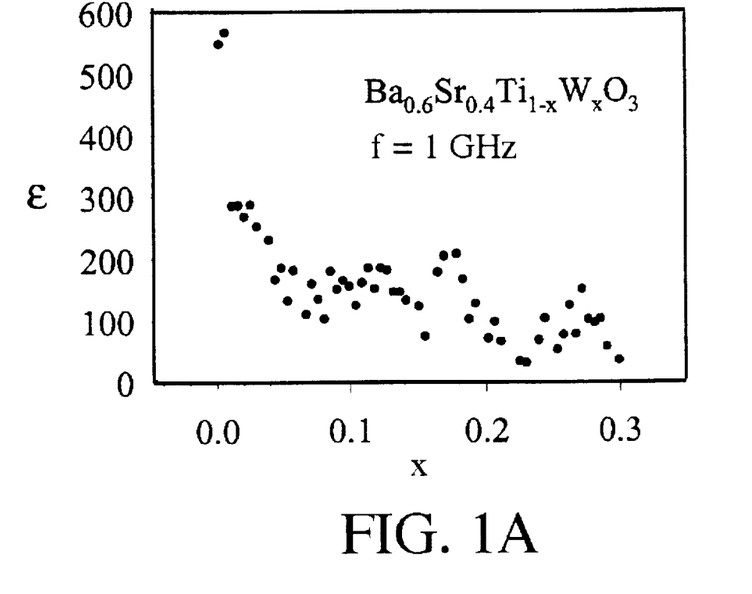
FIGS. 1A and 1B graphically illustrate the respective $\tan\delta$ and $\in_{rel}$ coefficients for the material $(Ba_{0.6}Sr_{0.4})(Ti_{1-x}W_x)O_3$, for x in the range $0 \leq x \leq 0.35$.
Figure 1B:
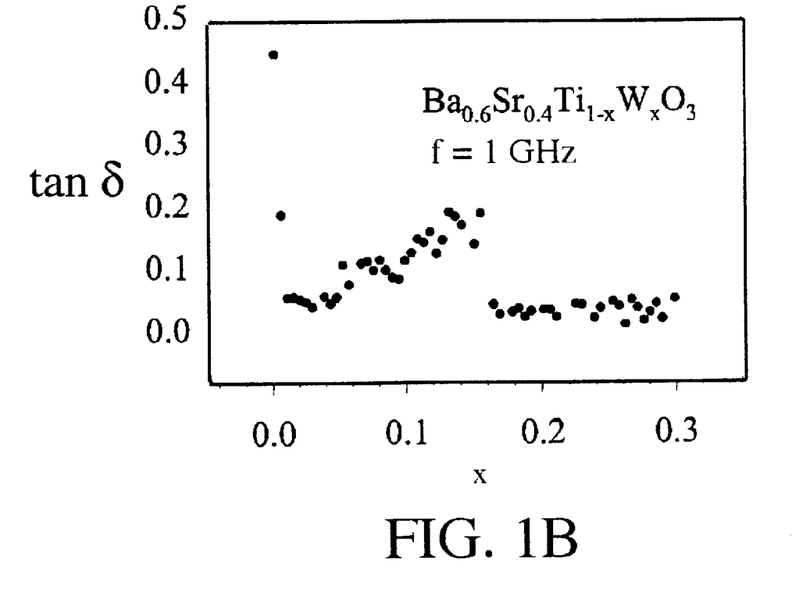

FIGS. 1A and 1B graphically illustrate the respective loss and relative dielectric coefficients, $\tan\delta$ and $\in$ for a compound material $(Ba_{0.6}Sr_{0.4})(Ti_{1-x}W_x)O_3$ on a selected substrate LaAlO$_3$, with $0 \leq x \leq 0.35$ and at a frequency f=1 GHz. As the index x increases to above x=0.015, the loss tangent $\tan\delta$ drops sharply from 0.2–0.5 to values of the order of 0.001. As x increases from 0.0 to 0.35, the relative dielectric coefficient $\in_{rel}$ decreases, although not monotonically, from about 300 to values in the range 50–100.

Example 2

Figure 2A:
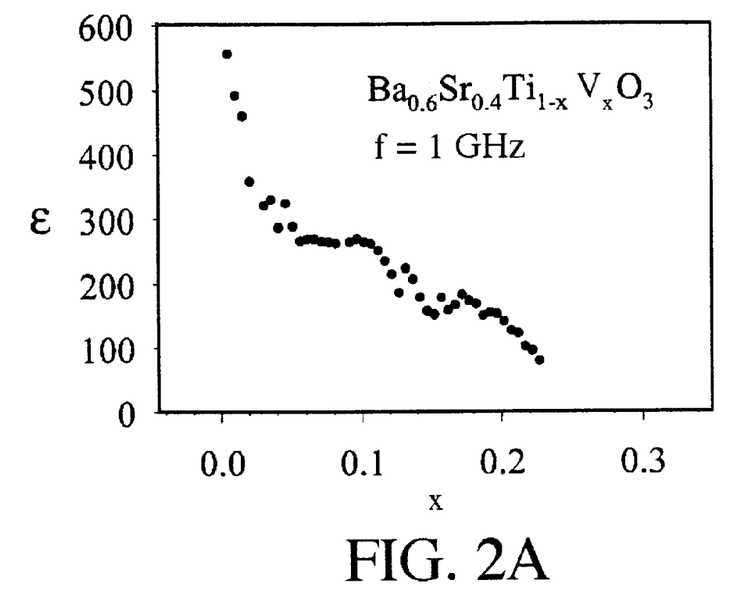
FIGS. 2A and 2B graphically illustrate the respective $\tan\delta$ and $\in_{rel}$ coefficients for the material $(Ba_{0.6}Sr_{0.4})(Ti_{1-x}V_x)O_3$, for x in the range $0 \leq x \leq 0.35$.
Figure 2B:
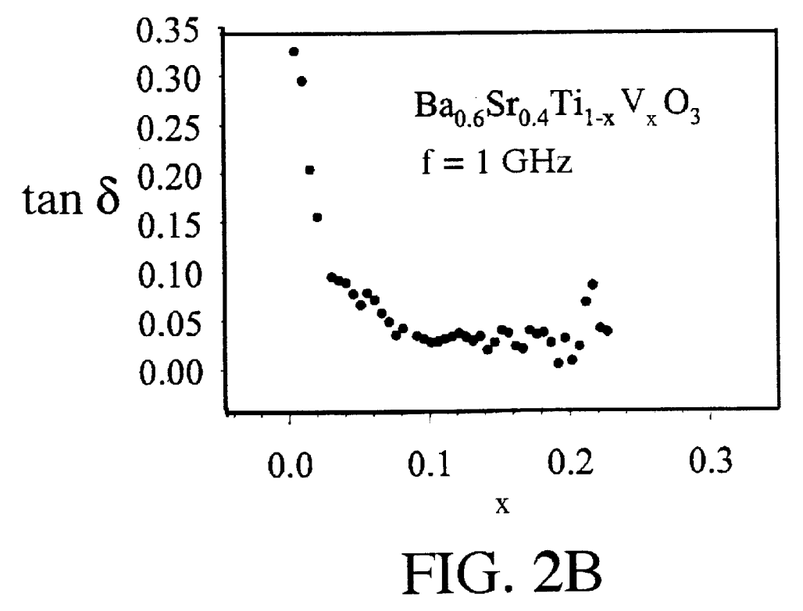

FIGS. 2A and 2B graphically illustrate the respective loss and relative dielectric coefficients, $\tan\delta$ and $\in$ for a compound material $(Ba_{0.6}Sr_{0.4})(Ti_{1-x}V_x)O_3$ on a selected substrate LaAlO$_3$, with $0 \leq x \leq 0.35$ and at a frequency f=1 GHz. As the index x increases from x=0.03 to x=0.35, the loss tangent $\tan\delta$ drops slowly from 0.10 to values of the order of 0.01–0.05. As x increases from 0.0 to 0.35, the relative dielectric coefficient $\in_{rel}$ decreases, approximately monotonically, from about 600 to about 100.

Example 3

Figure 3A:
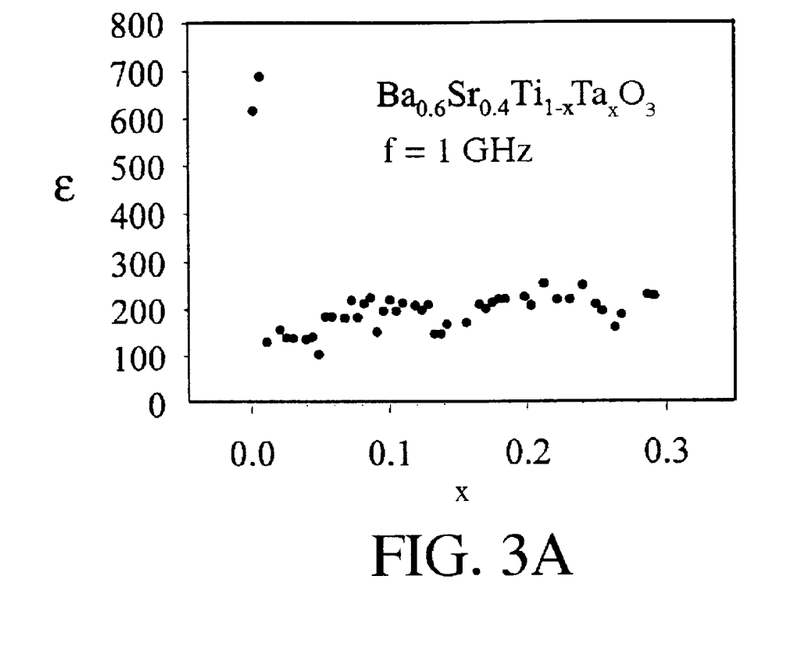
FIGS. 3A and 3B graphically illustrate the respective $\tan\delta$ and $\in_{rel}$ coefficients for the material $(Ba_{0.6}Sr_{0.4})(Ti_{1-x}Ta_x)O_3$, for x in the range $0 \leq x \leq 0.35$.
Figure 3B:
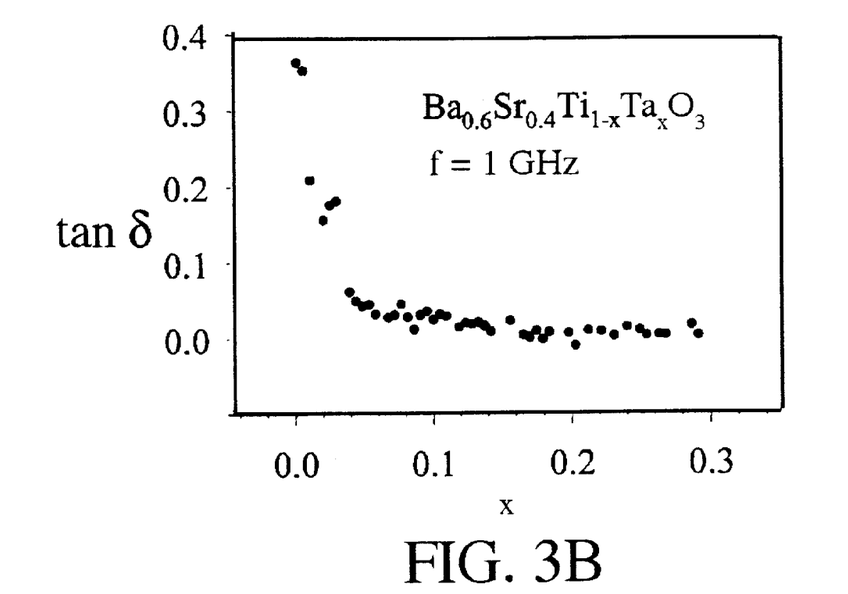

FIGS. 3A and 3B graphically illustrate the respective loss and relative dielectric coefficients, $\tan\delta$ and $\in$ for a compound material $(Ba_{0.6}Sr_{0.4})(Ti_{1-x}Ta_x)O_3$ on a selected substrate LaAlO$_3$, with $0 \leq x \leq 0.35$ and at a frequency f=1 GHz. As the index x increases from 0.01 to 0.35, the loss tangent $\tan\delta$ drops sharply from 0.37 to values of the order of 0.001–0.005. As x increases from 0.01 to 0.35, the relative dielectric coefficient $\in_{rel}$ is approximately constant, in a range 100–200.

Example 4

Figure 4A:
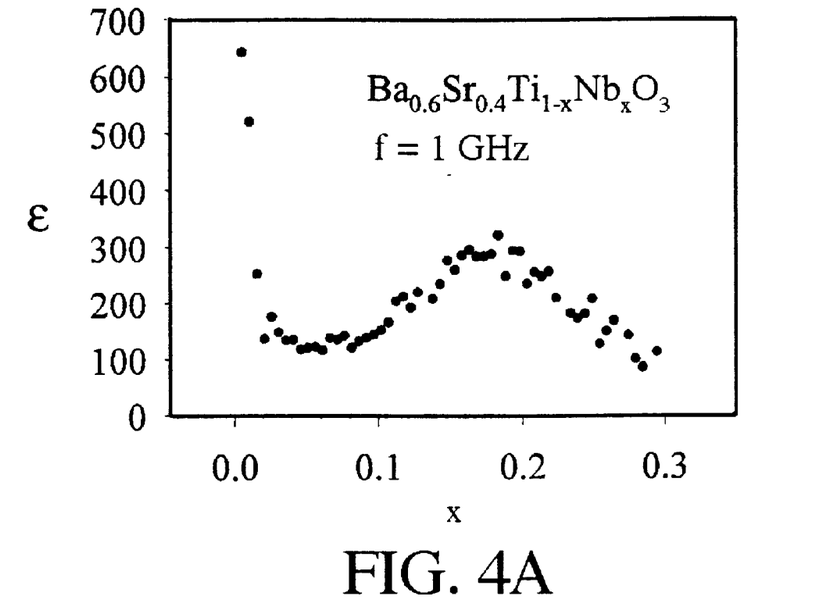
FIGS. 4A and 4B graphically illustrate the respective $\tan\delta$ and $\in_{rel}$ coefficients for the material $(Ba_{0.6}Sr_{0.4})(Ti_{1-x}Nb_x)O_3$, for x in the range $0 \leq x \leq 0.35$.
Figure 4B:
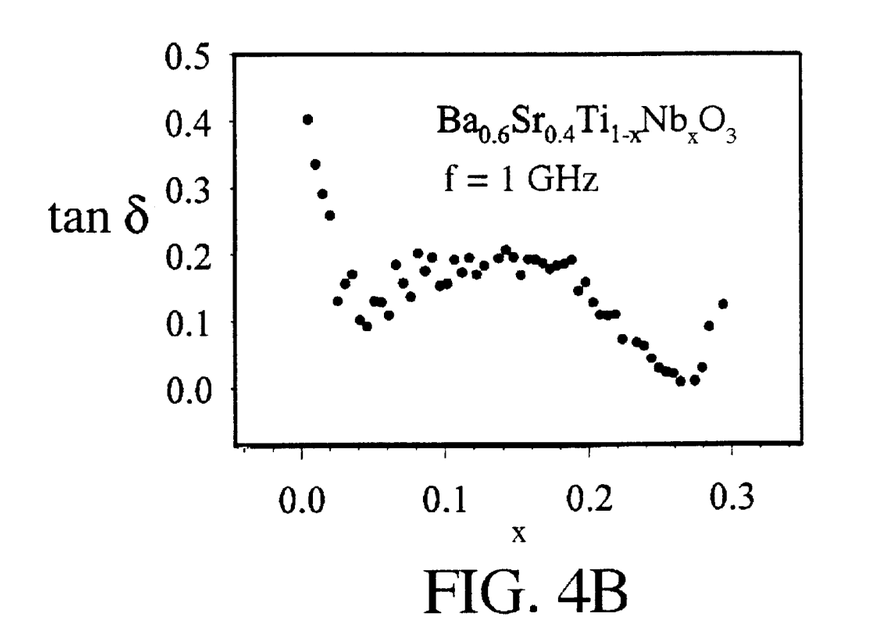

FIGS. 4A and 4B graphically illustrate the respective loss and relative dielectric coefficients, $\tan\delta$ and $\in$, for a compound material $(Ba_{0.6}Sr_{0.4})(Ti_{1-x}Nb_x)O_3$ on a selected substrate LaAlO$_3$, with $0 \leq x \leq 0.35$ and at a frequency f=1 GHz. As the index x increases from 0.03 to 0.35, the loss tangent $\tan\delta$ varies from 0.4 to 0.05. As x increases from 0.01 to 0.35, the relative dielectric coefficient $\in_{rel}$ varies in a range 100–250.

Figure 5A:
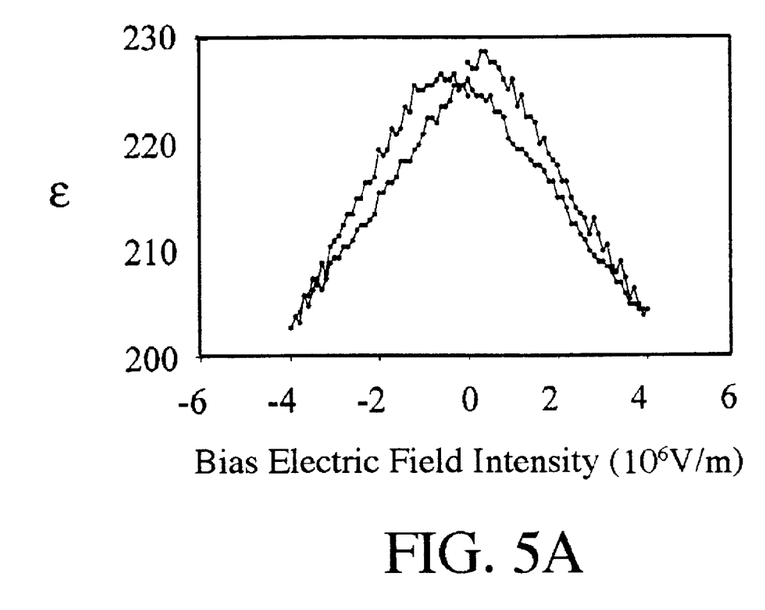
FIGS. 5A and 5B graphically illustrate tunability of the respective $\tan\delta$ and $\in_{rel}$ coefficients for the material $(Ba_{0.6}Sr_{0.4})(Ti_{0.78}W_{0.22})O_3$, as a function of bias electric field intensity.
Figure 5B:
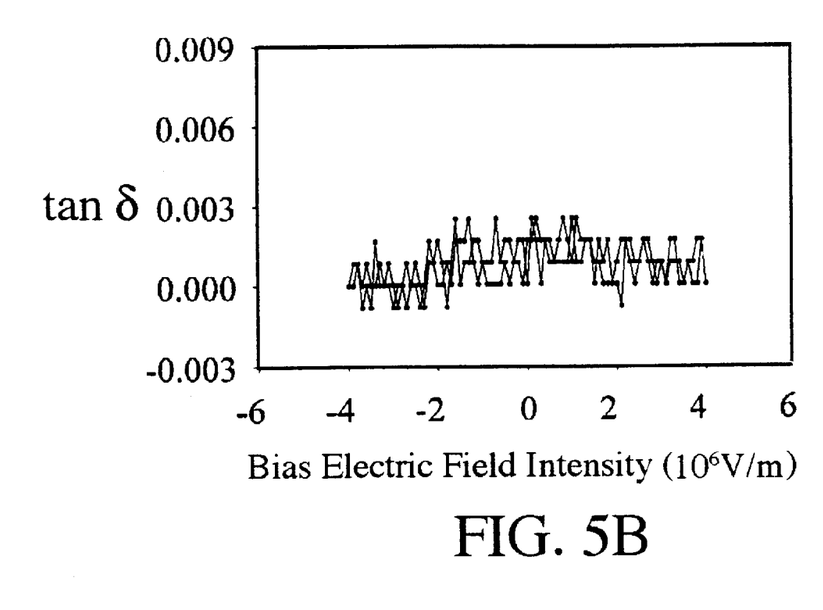

FIGS. 5A and 5B graphically illustrate variation or tunability of the relative dielectric coefficient $\in_{rel}$ and loss tangent $\tan\delta$, respectively, with variation of a bias electric field intensity E(bias) ($10^5$ volts/meter) for a particular material, $(Ba_{0.6}Sr_{0.4})(Ti_{0.78}W_{0.22})O_3$. Note that the value of $\in_{rel}$ (≈225) is highest near E(bias)=0 and declines approximately monotonically as the magnitude |E(bias)| increases; and $\in_{rel}$ changes by about 15% at E(bias)=4×10$^6$ volts/m.

Figure 6A:
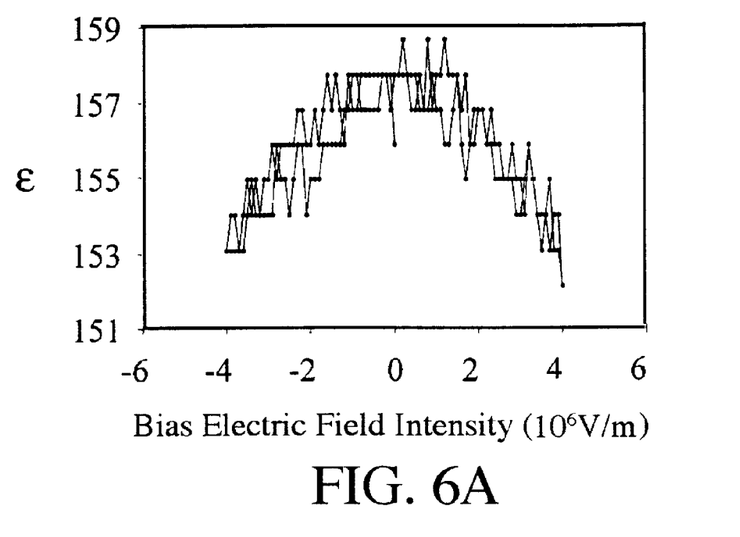
FIGS. 6A and 6B graphically illustrate tunability of the respective $\tan\delta$ and $\in$ coefficients for the material $(Ba_{0.6}Sr_{0.4})(Ti_{0.83}V_{0.17})O_3$, as a function of bias electric field intensity.
Figure 6B:
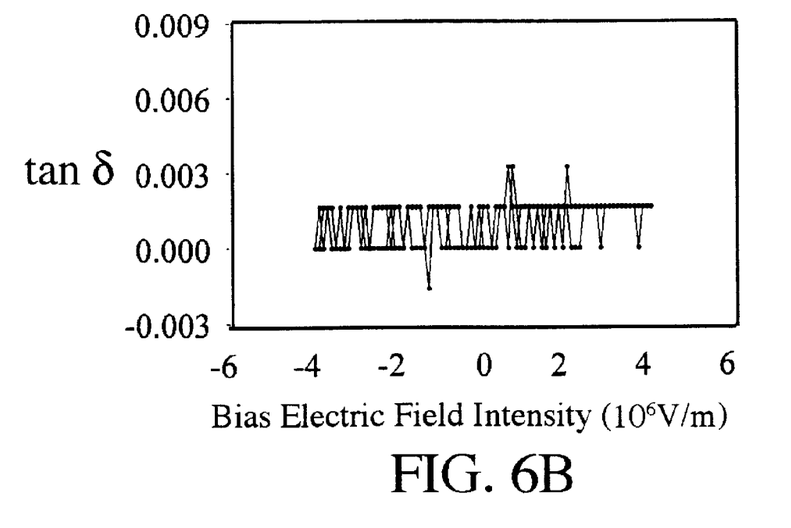

FIGS. 6A and 6B graphically illustrate the variation or tunability of the relative dielectric coefficient $\in_{rel}$ and loss tangent tanδ, respectively, with variation of a bias electric field intensity E(bias) (10$^5$ volts/m) for a particular material, $(Ba_{0.6}Sr_{0.4})(Ti_{0.83}V_{0.17})O_3$. The value of $\in_{rel}$ (≈225) is highest near E(bias)=0 and tends to decline as the magnitude |E(bias)| increases; and $\in_{rel}$ changes by less than 3% at E(bias)=4×10$^6$ volts/m.

Figure 7:
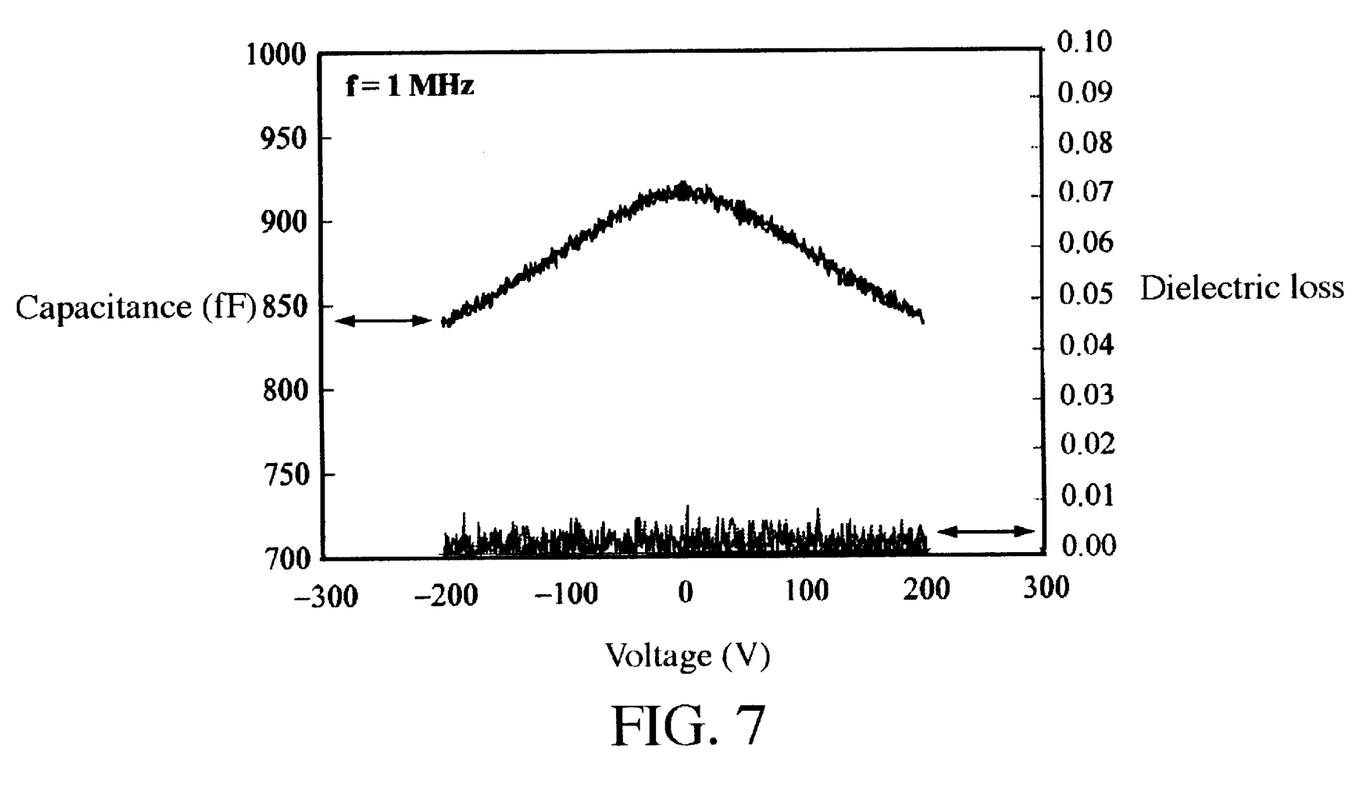
FIG. 7 graphically illustrates tunability of the dielectric loss coefficient $\in_{loss}$ for the substance or mixture $(Ba_{0.6}Sr_{0.4})(Ti_{0.9}Ta_{0.1})O_3$, as a function of voltage.

FIG. 7 graphically illustrates variation or tunability of dielectric constant $\in_{rel}$ and dielectric loss $\in_{loss}$ (>0) with applied voltage V for a thin film material, $(Ba_{0.6}Sr_{0.4})(Ti_{0.9}Ta_{0.1})O_3$, prepared on an MgO substrate. Note that C is highest for zero applied voltage and decreases approximately monotonically as |V| increases.

Figure 8:
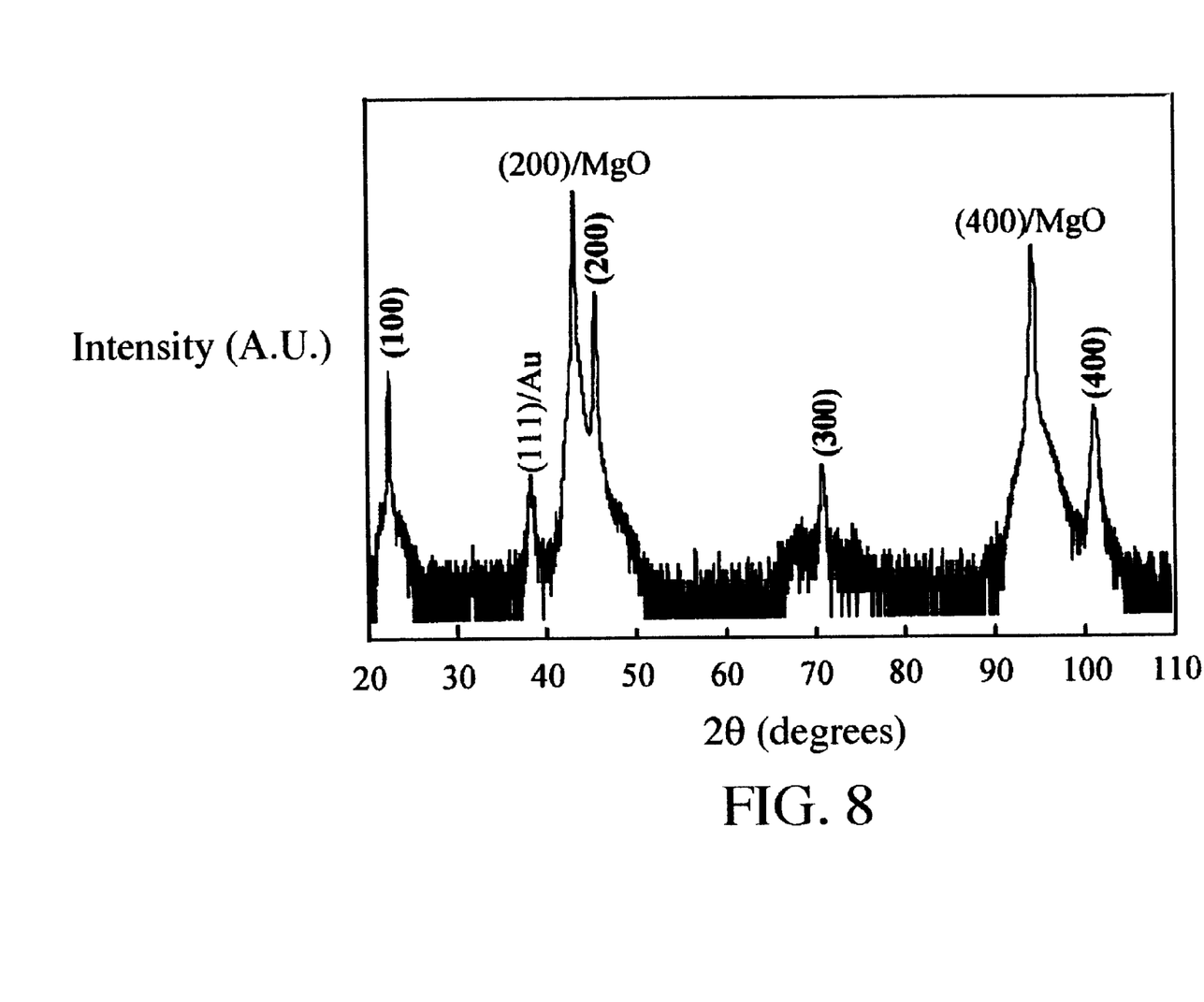
FIGS. 8 and 9 are spectra resulting from X-ray diffraction patterns of $(Ba_{0.6}Sr_{0.4})(Ti_{0.7}Ta_{0.25}W_{0.05})O_3$ and $(Ba_{0.6}Sr_{0.4})(Ti_{0.9}Ta_{0.1})O_3$, prepared as thin film substances on a bulk ceramic and on MgO, respectively.

FIG. 8 is an intensity spectrum produced by a 2-theta scan or diffraction pattern of a thin film material, $(Ba_{0.6}Sr_{0.4})(Ti_{0.9}Ta_{0.1})O_3$, grown on an MgO substrate by ion beam sputtering. The cleanness of this spectrum indicates that the material is present in a single phase.

Figure 9:
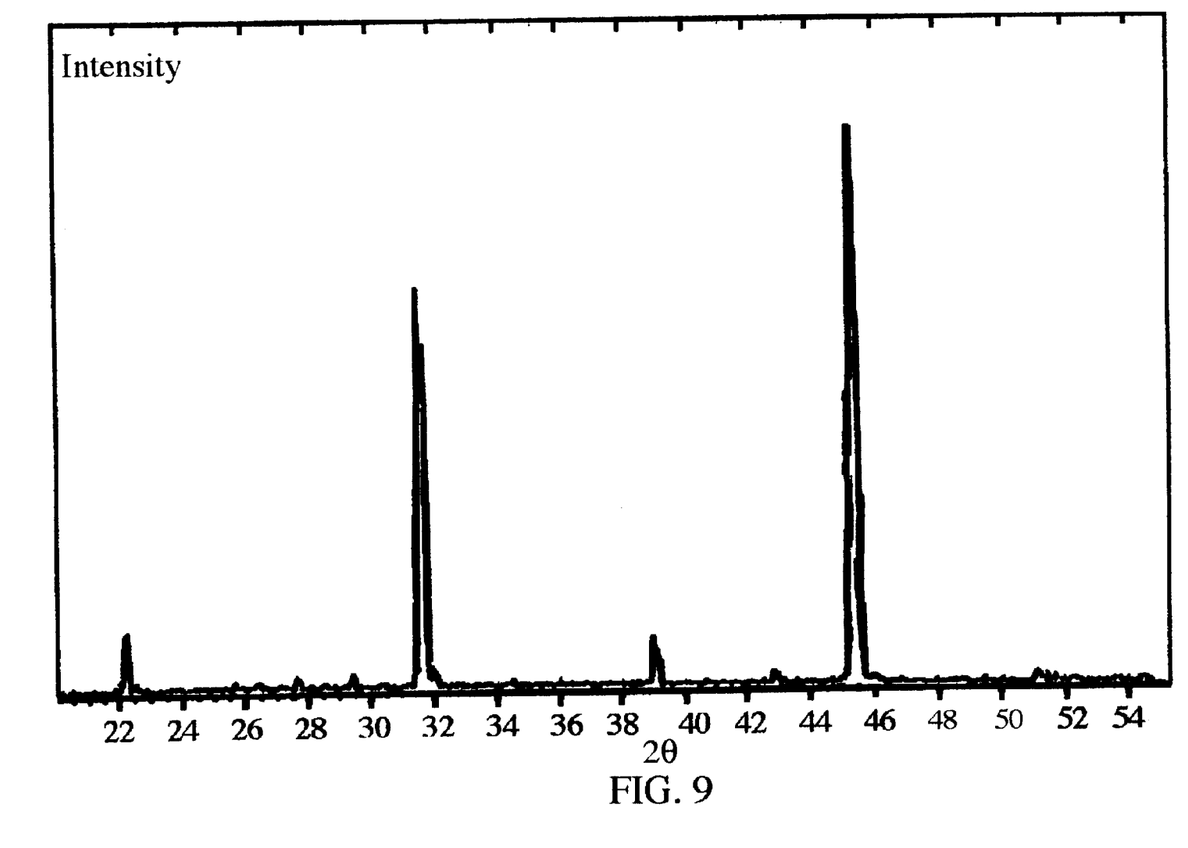

FIG. 9 is a spectrum produced by a 2-theta scan or diffraction pattern of a bulk ceramic material, $(Ba_{0.6}Sr_{0.4})(Ti_{0.70}Ta_{0.25}W_{0.05})O_3$. The cleanness of this spectrum also indicates that the material is present in a single phase.

The combinatorial material libraries in examples 1–4 were synthesized by ion beam sputtering, using a shadow mask for precision control. The multilayer precursors with a selected thickness profile for each layer were then annealed to form and form single phase material with an approximately uniform composition across a film thickness. Measurements of the relative dielectric coefficient values e were performed by a Microwave Scanning Microscope at a frequency f=1 GHz.

In the examples 1–4, a decrease of tanδ by about two orders of magnitude is observed, while the relative dielectric coefficient remains in the range 50–300. The loss tangent values are competitive with the best bulk ceramic values and are below the lower detection limit of the Microwave Scanning Microscope. The observed values for tanδ are consistent with the goal of impeding formation of $Ti^{3+}$ ions, which can support an electronic conduction mechanism in octahedral sites and eddy currents, and encouraging formation of $Ti^{4+}$ ions, using a reaction such as $Ti^{3+} \rightarrow Ti^{4+}+e^-$. In some previous work, $Mn^{3+}$ ions were used successfully to suppress formation of $Fe^{2+}$ ions in substances or mixtures such as $NiFe^{3+}_{2-x}Mn^{3+}_xO_4$.

The measured data for the doped barium titanate are very similar to data for a modified spinel ferrite, with the loss tangents reaching a minimum in a composition range 0.02≦x≦0.05, with one difference: the tanδ data for the doped titanates become relatively flat for x larger than about 0.1. The fact that the present data are obtained using thin films, while the earlier spinel ferrite data are obtained from bulk ceramics, may explain part or all of the discrepancy.

The group of materials $(Ba_ySr_{1-y})(Ti_{1-x}M_x)O_3$, provided by the invention have several applications that require relatively high values of $\in_{rel}$ and very low values of tanδ. A first application is to dielectric filters and duplexer oscillators, for which $\in_{rel}$=50–300 and tanδ<0.001 are desirable. A second application is to tunable filters, where $\in_{rel}$=50–200 and tanδ<0.001, with Δ$\in$/$\in$≧10 percent are desirable. The dielectric coefficient $\in$ can be adjusted by applying a variable magnetic field.

Ideally, the valence(s) of the element M in the composition $(Ba_ySr_{1-y})(Ti_{1-x}M1_x)O_3$, should be 4+, 5+, 6+ or more, in order to suppress the motion of, or absorb, electrons in the field of such a composition. The best performance found thus far is for a mixture $(1-c1)\cdot(Ba_{0.6}Sr_{0.4})(TiO_3)+c1\cdot(Ba_{0.6}Sr_{0.4})(TaO_3)$, where the fraction c1 satisfies 0≦c1≦0.3. X-ray diffraction data, such as those illustrated in FIGS. 8 and 9, indicate that this material is a single phase material with a measured lattice constant that increases from 3.965 Å to 3.990 Å as the fraction c1 of Ta increases from 0 to 0.3.

The substance or mixture $(Ba_ySr_{1-y})(Ti_{1-x}M_x)O_3$, may also be fabricated as a thin film on a substrate of selected composition or as a bulk ceramic by powder sintering.

A microbeam X-ray diffractometer was used to measure the crystal structure as a function of composition in a material library. The results for $(Ba_ySr_{1-y})(Ti_{1-x}Ta_x)O_3$ and $(Ba_ySr_{1-y})(Ti_{1-z}V_z)O_3$ are discussed in the following.

X-ray Diffraction of $(Ba_ySr_{1-y})(Ti_{1-x}Ta_x)O_3$. The (002) diffraction peak for this material moves toward lower angles, corresponding to increasing crystal lattice parameters, as the Ta fraction x increases from x=0 to x=0.18. The (002) diffraction peak then moves toward higher angles, corresponding to decreasing lattice parameters, as x increases beyond 0.18 up to x=0.3 (perovskite lattice structure). Due to the method of preparation of these thin films, the Ta ion will exit predominantly in the form $Ta^{4+}$. The ionic radii of $Ta^{4+}$ and $Ti^{4+}$ are 0.68 Å and 0.61 Å, respectively. Because the $Ta^{4+}$ radius is larger than the $Ti^{4+}$ radius, replacement of $Ti^{4+}$ ions by $Ta^{4+}$ ions causes an increase of one or more of the crystal lattice parameters, for relatively small values of the Ta fraction x.

It is unclear why a lattice parameter of the resulting material becomes larger as x increases beyond x=0.18. One possible reason is that some of the $Ta^{4+}$ ions may become transformed into $Ta^{5+}$ ions, because $Ta^{5+}$ is a more stable form than is $Ta^{4+}$, under normal conditions, and attraction between $Ta^{5+}$ ions and $O2^-$ ions is stronger than a corresponding attraction between $Ta^{4+}$ ions and $O^{2-}$ ions. This increased attraction causes a corresponding smaller Ta-O octahedron, with a correspondingly smaller lattice parameter. The difference between $Ta^{4+}$ ionic radius and $Ti^{4+}$ ionic radius, which may be the reason that $(Ba_ySr_{1-y})(Ti_{1-x}Ta_x)O_3$ still possesses a perovskite structure for values of the Ta fraction x up to x=0.3.

X-ray Diffraction of $(Ba_ySr_{1-y})(Ti_{1-z}V_z)O_3$. The (002) diffraction peak for this material moves toward higher angles, corresponding to decreasing crystal lattice parameters, as the V fraction z increases from z=0 to z=0.18. The (002) diffraction peak disappears for higher values of the fraction z. The V ion will exit predominantly in the form $V^{4+}$. The ionic radii of $V^{4+}$ and $Ti^{4+}$ are 0.58 Å and 0.61 Å, respectively. Because the $V^{4+}$ radius is larger than the $Ti^{4+}$ radius, replacement of $Ti^{4+}$ ions by $V^{4+}$ ions causes an decrease of one or more of the crystal lattice parameters, for relatively small values of the V fraction z. When the $V^{4+}$ ion displaces the $Ti^{4+}$ ion and/or enters a void in the oxygen octahedron, the perovskite structure is progressively destroyed, and the (002) diffraction peak disappears.

It is well known that an oxygen vacancy and reduction of $Ti^{4+}$ to $Ti^{3+}$ occurs easily in $Ba_ySr_{1-y}TiO_3$. This change increases the electrical charges in the material and increases the tangent loss coefficient tanδ for the material. Addition of an element $M^{5+}$ can prevent development of an oxygen vacancy and reduction of $Ti^{4+}$ to $Ti^{3+}$, which will reduce the loss tangent value. In many applications, the relative dielectric coefficient value $\in_{rel}$ needs to be several hundreds. Because of the lower polarization of $Ta^{4+}$, relative to $Ti^{4+}$, substitution of Ta for Ti will decrease the value $\in_{rel}$.

When the fraction y in the material $Ba_ySr_{1-y}TiO_3$ is greater than 0.5, the Curie temperature is at or above room temperature. Although the tunability is high in this range, the loss tangent is too high to be useful in most microwave work. Addition of $Ta^{5+}$ can shift the Curie temperature to lower values. Although tunability will be affected to some extent by addition of $Ta^{5+}$, the tangent loss value for the ceramic body will be lowered (and thus improved) dramatically, and a tunable material with relatively high Ba content will be obtained. Addition of $Ta^{5+}$ is not, by itself, sufficient, in part because of an unbalanced replacement of $Ti^{4+}$. Selective addition of trivalent ions into the material will balance the excess $Ta^{5+}$ and may improve the tangent loss coefficient further. The size effect, distortion of a crystal cell and modest increase of the loss tangent, due to the added trivalent ions, also must be accounted for. Preferably, the radii of all ions substituted into the initial material $Ba_ySr_{1-y}TiO_3$ should be as close as possible to the radii of $Ti^{4+}$.

Based on results of combinatorial synthesis, we have prepared $(Ba_{0.6}Sr_{0.4})(Ti_{1-x}Ta_x)O_3$ bulk ceramic materials. We observed a significant improvement in the tangent loss coefficient through partial substitution of Ta for Ti (x>0). However, the solid solution limit of Ta substitution in bulk ceramic corresponds to x≈0.1, which is much less than the limit (x≈0.3) for thin films. Substitution of trivalent elements, such as Al, Ga or Cr, plus Ta, for Ti will further improve the tangent loss coefficient for this material. The following are examples of the results.

Example 5

$BaTiO_3$ powder (purity 99.9%), $SrTiO_3$ powder (purity 99.9%) and $Ta_2O_3$ powder (purity 99.9%) were used as staring materials and were combined to form $(Ba_{0.6}Sr_{0.4})(Ti_{1-x}Ta_x)O_{3+0.5x}$, with x=0.02, 0.05, 0.06, 0.07 and 0.08. The mass of each of these powders was 10–20 gm. Each formulated powder was mixed with ethanol (20–30 ml) and processed in a vibrating mill using agate jar and media for a time interval of 15–30 min, sieved at 200 mesh and dried.

Calcination of the powder was carried out in a zirconia crucible in air at a temperature T=1350° C. for 3 hours. The temperature elevation rate was +10° C./min, and the cooling rate was −10° C./min. After calcination, 0.1–0.2 gm organic binder (methyl cellulose and 20–30 ml ethanol were added to agate jar with the calcined powder and subjected to secondary pulverization in a vibration mill for 40–60 min.

The slurry was then dried and sieved at mesh 60 to further improve the homogeneity of the sample. The dry powder was molded into two cylinders of φ12.80×5.50 mm and φ05.00×2.50 m under a pressure of 100 MPa.

The molding product was degreased in air at T=700° C. for 3 hours, then sintered at T=1480° C. for 3 hours. The temperature elevation rate was 10° C./min, and the cooling rate was −5° C./min. The fired products were polished at both end faces to form dielectric specimens. For the smaller specimen of each of the samples, values of $\in_{rel}$, f·Qu (GHz) and $\tau_f$ were measured in a cavity type columnar resonator ($TEO_{011}$ mode). The measuring frequency range was 2–10 GHz. The parameter $\tau_f$ was measured over a temperature range T=25–50° C. and calculated according to $\tau_f=(f_{50}-f_{25})/(f_{25}·\Delta T)$, with $\Delta t=25°$ C. For each of the larger specimens, a tunability value was measured. The values of $\in_{rel}$, f·Qu and $\tau_f$ for each of the composition fractions x are set forth in: Table 1.

TABLE 1

Test Example 1 Measurements for Variable Ta Content

| | x = | | | | |
|---|---|---|---|---|---|
| | 0.02 | 0.05 | 0.06 | 0.07 | 0.08 |
| $\in_{rel}$ | 1012.3 | 742.6 | 652.8 | 558.7 | 529.2 |
| f · Qu (GHz) | 234.2 | 732 | 899.4 | 1014.2 | 775.6 |
| $\tau_f$ (ppm) | 5119.2 | 4265.2 | 3196.4 | 3354.1 | 2940.9 |

From the results in Table 1, one verifies that $\in_{rel}$ and $\tau_f$ each decrease approximately linearly with increasing values of x in the range 0.02≤x≤0.07. The decrease of $\in_{rel}$ for higher values of x is smaller. The value f·Qu reaches a maximum at or around x=0.07 and decreases for larger or smaller values of x.

Example 6

Bulk ceramic substances or mixtures of composition $Ba_{0.6}Sr_{0.4}Ti_{0.92}Ta_{0.07}M_{0.01}O_3$, were prepared by the approach of Example 5, where the substance or mixture M includes one or more of the trivalent elements Al, Ga or Cr (each of purity 99.9%). The values of $\in_{rel}$, f·Qu and $\tau_f$ for each of the three compositions are set forth in Table 2.

TABLE 2

Test Example 6 Measurements for Al, Ga and Cr

| | Al | Ga | Cr |
|---|---|---|---|
| $\in_{rel}$ | 493.2 | 518.1 | 510.8 |
| f · Qu (GHz) | 1127.6 | 1002.5 | 1062.3 |
| $\tau_f$ (ppm) | 2293.8 | 2707.0 | 2553.5 |

The relative dielectric coefficient $\in_{rel}$ can be lowered by adding one of the trivalent cations Al, Ga or Cr, but the resulting values for f·Qu and $\tau_f$ are not changed much, relative to the corresponding values of the material $Ba_{0.6}Sr_{0.4}Ti_{0.93}Ta_{0.07}O_3$, using these compositions. The trivalent element Al was studied further.

Example 7

Bulk ceramic materials of composition $Ba_{0.6}Sr_{0.4}Ti_{0.93-z}Ta_{0.07}Al_zO_3$, were prepared by the approach of Example 5, with z=0, 0.01, 0.02, 0.03, 0.04 and 0.05.

TABLE 3

Test Example 7 Measurements for Variable Al Content

| | z = | | | | |
|---|---|---|---|---|---|
| | 0.00 | 0.01 | 0.03 | 0.04 | 0.05 |
| $\in_{rel}$ | 558.7 | 510.9 | 447.8 | 403.6 | 356.1 |
| f · Qu (GHz) | 1014.2 | 1062.3 | 1249.9 | 1118.6 | 1094.6 |
| $\tau_f$ (ppm) | 3354.1 | 2553.5 | 2303.2 | 2091.3 | 1833.1 |

The relative dielectric coefficient $\in_{rel}$ and the value $\tau_f$ decrease approximately linearly with increasing Al content (0≤z≤0.05). The value f·Qu reaches a maximum value at or around z=0.03 and decreases for larger or smaller values of z. From the results for f·Qu set forth in Tables 1, 2 and 3, the materials $Ba_{0.6}Sr_{0.4}Ti_{0.90}Ta_{0.07}Al_{0.03}O_3$ and $Ba_{0.6}Sr_{0.4}Ti_{0.89}Ta_{0.08}Al_{0.03}O_3$ are preferred. For most microwave applications, the desired material properties are relatively high dielectric constant, which is tunable with varying bias electrical field, low tangent loss parameter, and low electrical conductivity (or low leakage current).

What is claimed is:

1. A low loss material for microwave applications, having a relative dielectric coefficient $\epsilon_{rel}$ that is at least equal to 50 and is tunable with variable electrical field bias and a loss tangent no larger than 0.03, the material having a composition of $Ba_ySr_{1-y}(Ti_{1-x}M_x)O_3$, where M is an element drawn from a group consisting of Ta, V, Nb, Mo, W, and the indices x and y satisfy $0.02 \leq x \leq 0.3$ and $0 \leq y \leq 1$.

2. The material composition of claim 1, wherein at least one of said elements in said substance or mixture M is chosen to suppress conversion of $Ti^{4+}$ ions to $Ti^{3+}$ ions in said material.

3. The material composition of claim 1, wherein said relative dielectric constant $\epsilon_{rel}$ is tunable with electric field intensity E, with a normalized tuning range, $\{\epsilon_{rel}(E=0) - \epsilon_{rel}(E)\}/\epsilon_{rel}(E=0)$, that ranges from 0 percent to about 15 percent as E varies over a range $-4 \times 10^4$ volts/cm $\leq E \leq +4 \times 10^4$ volts/cm.

4. The material composition of claim 3, wherein said loss tangent is less then 0,003 as said electric field intensity E varies over said range $-4 \times 10^4$ volts/cm $\leq E \leq +4 \times 10^4$ volts/cm.

* * * * *